United States Patent [19]

Lee

[11] Patent Number: 5,835,449
[45] Date of Patent: Nov. 10, 1998

[54] HYPER PAGE MODE CONTROL CIRCUIT FOR A SEMICONDUCTOR MEMORY DEVICE

[75] Inventor: Jin-Young Lee, Seoul, Rep. of Korea

[73] Assignee: SAmsung Electronics, Co., Ltd., Suwon, Rep. of Korea

[21] Appl. No.: 756,144

[22] Filed: Nov. 27, 1996

[30] Foreign Application Priority Data

Nov. 27, 1995 [KR] Rep. of Korea .................. 1995 43972

[51] Int. Cl.⁶ ....................................................... G11C 7/00
[52] U.S. Cl. .................. 365/238.5; 365/203; 365/189.11
[58] Field of Search .................................. 365/238.5, 203, 365/189.11, 230.06; 395/855

[56] References Cited

U.S. PATENT DOCUMENTS

| | | | |
|---|---|---|---|
| 4,551,821 | 11/1985 | Yokouchi et al. ....................... | 365/203 |
| 4,740,921 | 4/1988 | Lewandowski et al. ................ | 365/203 |
| 4,996,671 | 2/1991 | Suzuki et al. ............................ | 365/203 |
| 5,309,401 | 5/1994 | Suzuki et al. ............................ | 365/203 |
| 5,349,560 | 9/1994 | Suh et al. ................................. | 365/203 |
| 5,357,474 | 10/1994 | Matano et al. .......................... | 365/203 |
| 5,367,495 | 11/1994 | Ishikawa ............................... | 365/238.5 |
| 5,526,320 | 6/1996 | Zagar et al. ........................... | 365/238.5 |
| 5,528,552 | 6/1996 | Kamisaki .............................. | 365/238.5 |
| 5,532,961 | 7/1996 | Mori et al. ............................... | 365/194 |
| 5,539,700 | 7/1996 | Kawahara ............................... | 365/203 |
| 5,587,964 | 12/1996 | Rosich et al. ......................... | 365/238.5 |
| 5,625,601 | 4/1997 | Gillingham et al. .................. | 365/238.5 |

*Primary Examiner*—Tan T. Nguyen
*Attorney, Agent, or Firm*—Marger, Johnson, McCollom, & Stolowitz, P.C.

[57] ABSTRACT

An output control circuit for a semiconductor memory device allows the output data to be controlled by a write enable line and/or an output enable line in hyper page mode. An output write enable control signal is generated in response to a column address strobe signal, an output enable signal and a write enable signal. A precharge signal is generated in response to the output write enable control signal, thereby allowing a data bus line to be precharged in hyper page mode. The output enable signal and the write enable signal can be selectively coupled to an output write enable control signal generating circuit to allow the output control circuit to operate in different modes. A trigger signal, which controls a data output buffer and driver circuit, is controlled in response to a latch signal. The latch signal is generated by latching the write enable signal in response to the column address strobe signal. The output control circuit allows the data bus line to be precharged between consecutive bits of output data in hyper page mode.

19 Claims, 13 Drawing Sheets

HYPER PAGE MODE CONTROL CIRCUIT FOR A SEMICONDUCTOR MEMORY DEVICE

This application corresponds to Korean Patent application No. 43972/1995 filed Nov. 27, 1995 in the name of Samsung Electronics Co., Ltd. which is herein incorporated by reference.

BACKGROUND OF THE INVENTION

1. Field of the Invention

This invention relates generally to semiconductor memory devices and more particularly to an output signal control circuit for a semiconductor memory device that can operate in hyper page mode.

2. Description of the Related Art

The operation of a semiconductor memory device in conventional hyper page mode is different from the operation in fast page mode in that the data output signals do not change to a high impedance state but, instead, continuously retain the previous data even when the column address strobe signal is in a logic"High" state. The data signals all change directly into the data of the next cycle. This reduces the cycle time, and thus, the operating speed of the memory device can be increased by interleaving.

A problem with conventional hyper page mode is that the number of control signals used to control the output is reduced. In hyper page mode, the data output is controlled only by a row address strobe signal (RASB), a column address strobe signal (CASB) and an output enable signal (OEB). The data output is placed in a high impedance state only when RASB and CASB are all precharged. This limits the operation of the semiconductor device when it is used in a system.

FIG. 1 is a block diagram showing a prior art hyper page mode data output control system. As shown in FIG. 1, the data output control system includes a precharge control signal generating circuit 3 for precharging data bus lines (DB/DBB) in response to information from a row address strobe signal (RASB), a column address strobe signal (CASB) and an external address. The system also includes a precharge signal generating circuit 5 having an input terminal connected to an output terminal of the precharge control signal generating circuit 3 to output a precharge signal (CLKP) in response to the precharge control signal (PDOP). A data bus line precharge circuit 7 has an input terminal connected to an output terminal of the precharge signal generating circuit 5. The data bus line precharge circuit 7 is also coupled to DB/DBB to precharge DB/DBB in response to CLKP.

The data output control system also includes a data output buffer trigger signal generating circuit 9 for generating a trigger signal (CLKT) in response to RASB, CASB and an external address. A data output buffer and data output driver 11 has two input terminals connected to DB/DBB and another input terminal connected to an output terminal of the data output buffer trigger signal generating circuit 9. The data output buffer and data output driver 11 is controlled by the outputs of DB/DBB and CLKT to generate an output signal in accordance with the output data.

An operation cycle of a prior art system is shown in FIG. 7. In operation, If OEB changes from a logic"Low" to a logic"High", and then back to the logic"Low" state while RASB and CASB are in the active state, the output changes from the data output state Q0 (i.e., "0" or '"1") to the high impedance state, then back to the data output state of the previous data Q0. If OEB is toggled to the logic"High" state while CASB is precharged and RASB is"Low", the output is precharged to the high impedance state at the rising edge of OEB. Also, when OEB is changed to a logic"Low", the previous data are output at the falling edge of OEB and then the output changes at the falling edge of CASB to the next data Q1. The write enable signal (WEB) does not perform any during this cycle, and thus, it remains in the logic"High" state.

In the prior art system, there are two methods of controlling the data output state. That is, DB/DBB can be controlled by either CLKP or CLKT. In the conventional hyper page mode, also referred to as extended data output mode (EDO mode), the path for controlling the precharge of DB/DBB responsive to the external address is disabled so that a precharge operation cannot be generated by an address transition. Also, CLKT can only be disabled (placed in the logic"Low" state) when RASB and CASB were both precharged.

SUMMARY OF THE INVENTION

Accordingly, it is an object of the present invention to provide a data output signal control circuit in which it is possible to control the data output in hyper page mode not only by a row address strobe signal, a column address strobe signal or an output signal, but also by an output enable signal or a write enable signal.

It is another object of the present invention to provide a data output signal control circuit in which it is possible to precharge the data output in hyper page mode by using either an output enable signal or a write enable signal.

It is still another object of the present invention to provide a data output signal control circuit in which it is possible to control the data output in hyper page mode not only by a row address strobe signal, a column address strobe signal and an output signal, but also by an output enable signal or a write enable signal.

To achieve the above objects, an output control circuit for a semiconductor memory device allows the output data to be controlled by a write enable line and/or an output enable line in hyper page mode. An output write enable control signal is generated in response to a column address strobe signal, an output enable signal and a write enable signal. A precharge signal is generated in response to the output write enable control signal, thereby allowing a data bus line to be precharged in hyper page mode. The output enable signal and the write enable signal can be selectively coupled to an output write enable control signal generating circuit to allow the output control circuit to operate in different modes. A trigger signal, which controls a data output buffer and driver circuit, is controlled in response to a latch signal. The latch signal is generated by latching the write enable signal in response to the column address strobe signal. The output control circuit allows the data bus line to be precharged between consecutive bits of output data in hyper page mode.

One aspect of the present invention is a hyper page mode control circuit for a semiconductor memory device including a data output buffer coupled to data bus line for outputting data from the data bus line responsive to a trigger signal. The circuit also includes a precharge circuit coupled to the data bus line for precharging the data bus line responsive to a precharge signal. A precharge signal generating circuit coupled to the precharge circuit generates the precharge signal responsive to a precharge control signal and an output write enable control signal.

Another aspect of the present invention is a hyper page mode control circuit for a semiconductor memory device including a data output buffer coupled to a data bus line for outputting data from the data bus line responsive to a trigger signal, and a data output buffer trigger signal generating circuit coupled to the data output buffer. The data output buffer trigger signal generating circuit generates the trigger signal responsive to one or more strobe signals and a latch signal.

A further aspect of the present invention is a method for controlling a semiconductor memory device by controlling the state of an output data line in hyper page mode responsive to a write enable signal or an output enable signal.

The foregoing and other objects, features and advantages of the invention will become more readily apparent from the following detailed description of a preferred embodiment of the invention which proceeds with reference to the accompanying drawings.

DETAILED DESCRIPTION

Figure 4:
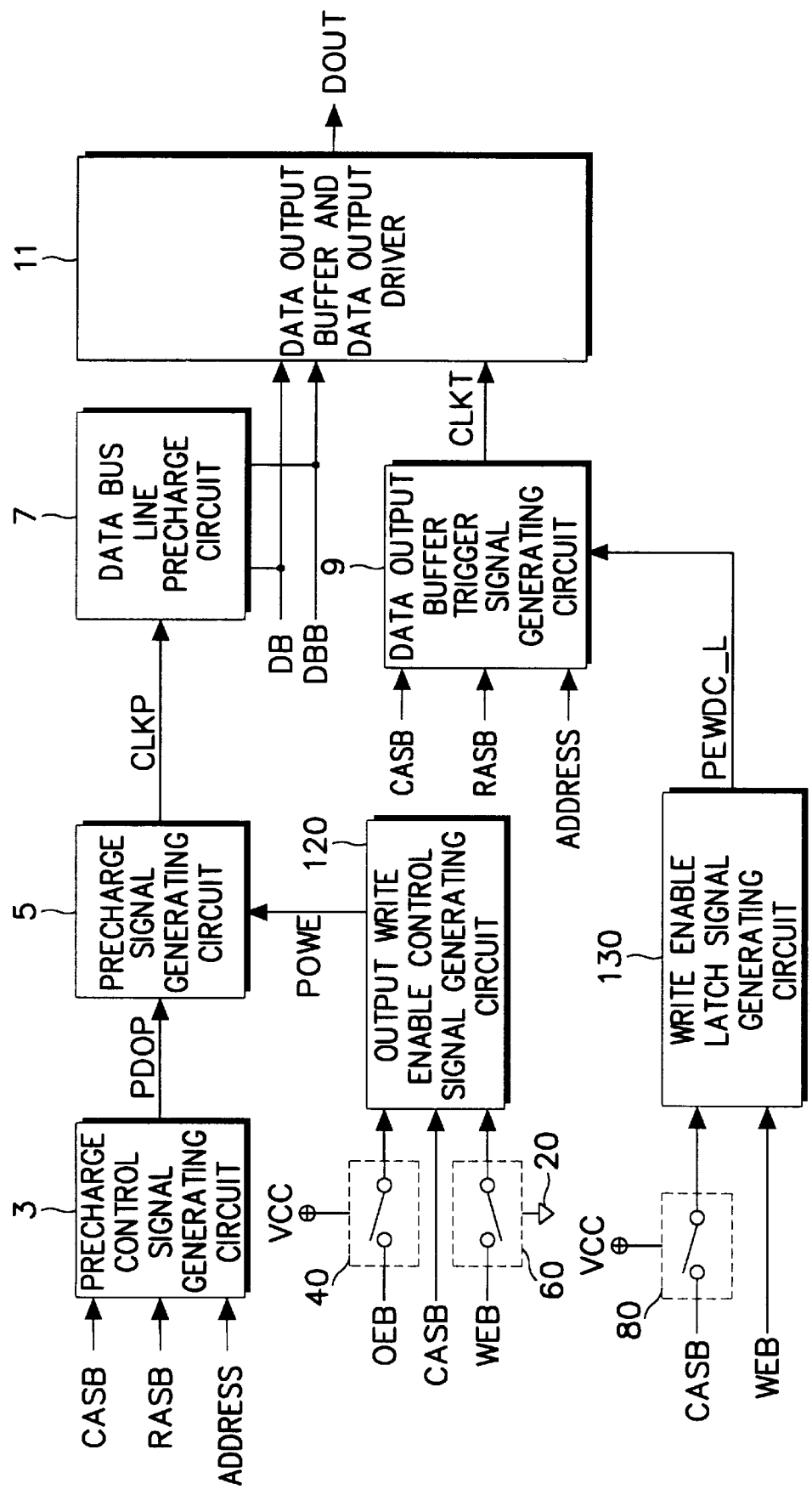
FIG. 4 is a block diagram of an embodiment of a data output control system in accordance with the present invention.

FIG. 4 is a block diagram of a data output control circuit in accordance with the present invention. The data output control circuit includes a precharge control signal generating circuit 30 for generating a precharge control signal (PDOP) to precharge data bus lines DB/DBB in response to a row address strobe signal (RASB), a column address strobe signal (CASB) and an external address. The data output control circuit also includes a precharge signal generating circuit 50 for generating a precharge signal (CLKP) in response to PDOP and an output write enable control signal (POWE). A data bus line precharge circuit 70 is coupled to the precharge signal generating circuit 50 and precharges DB/DBB in response to CLKP.

An output write enable control signal generating circuit 120 generates POWE in response to first, second, and third control signals which are received on first, second, and third input terminals, respectively. A first switching circuit 40 is connected to the first input terminal and selectively connects the first input terminal to either OEB or a source voltage (VCC). A second switching circuit 60 is connected to the second input terminal and selectively connects the second input terminal to either a write enable signal (WEB) or a ground voltage (VSS). The third input terminal is connected to receive CASB. The output write enable control signal generating circuit 120 will be described below in more detail with reference to FIG. 2.

Figure 1:
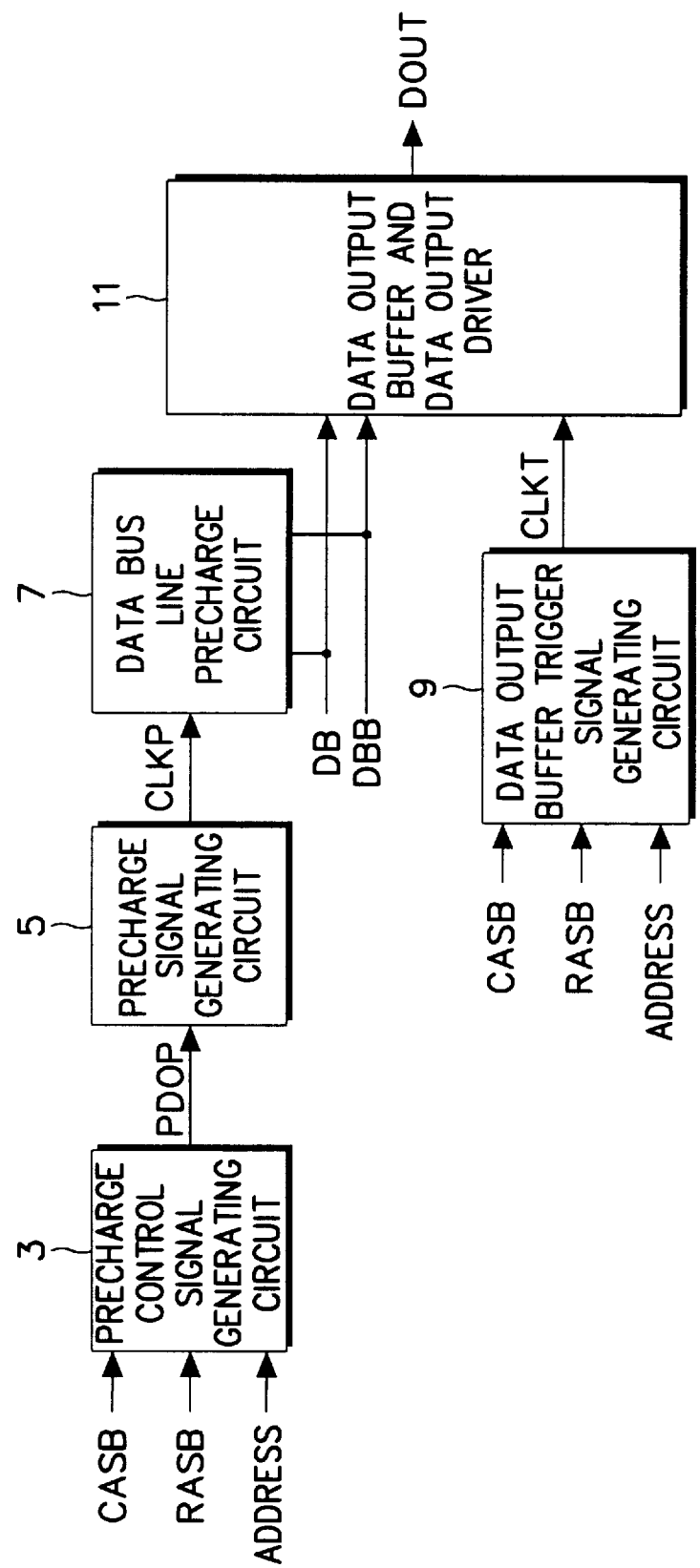
FIG. 1 is block diagram of a prior art data output control system for a semiconductor memory device that can operate in hyper page mode.

The data output control circuit of FIG. 4 also includes a data output buffer and driver circuit 110 which has input terminals connected to the output terminals of the data bus line precharge circuit 70 to receive DB/DBB. The circuit further includes a data output buffer trigger signal generating circuit 90, which is similar to the data output buffer trigger signal generating circuit 9 of FIG. 1, but has an additional input terminal for receiving a write enable latch signal (PEWDC_L). The data output buffer trigger signal generating circuit 90 generates the signal CLKT in response to a row address strobe signal (RASB), a column address strobe signal (CASB), an external address, and PEWDC_L. The signal CLKT determines the data output state by controlling the buffering and driving of the signals DB/DBB as will be described below in more detail with respect to FIGS. 2, 3 and 5.

A write enable latch signal generating circuit 130 generates the write enable latch signal (PEWDC_L) in response to fourth and fifth control signals which are received on fourth and fifth input terminals, respectively. A third switching circuit 80 is connected to the fourth input terminal and selectively connects the fourth input terminal to either CASB or the source voltage (VCC). The fifth input terminal is connected to receive WEB. The write enable latch signal generating circuit 130 will be described below in more detail with reference to FIG. 5.

Figure 2:
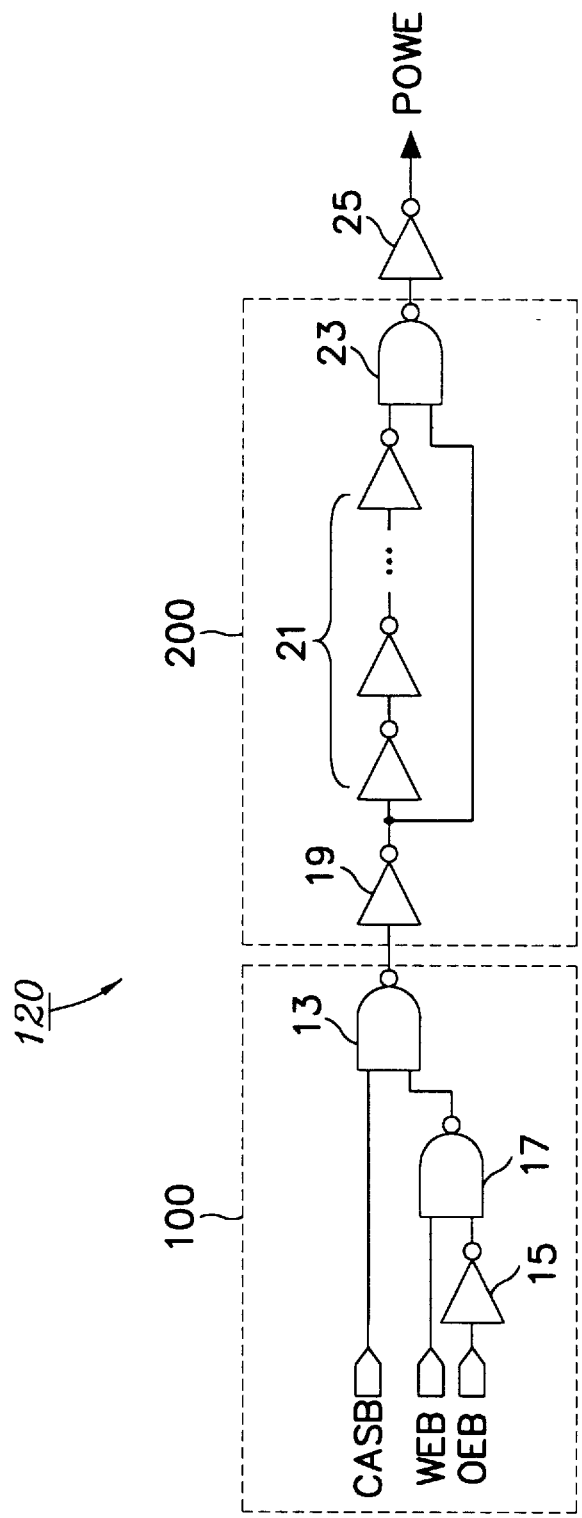
FIG. 2 is a schematic diagram of an embodiment of an output write enable control signal generating circuit in accordance with the present invention.

FIG. 2 is a detailed circuit diagram showing an output write enable control signal generating circuit 120 in accordance with the present invention. As shown in FIG. 2, the output write enable control signal generating circuit 120 includes an option circuit 100 having a first NAND gate 17 for performing a NAND operation on the complementary signals of a write enable signal (WEB) and an output enable signal (OEB), and a second NAND gate 13 for performing a NAND operation on the column address strobe signal (CASB) and the output signal of the first NAND gate 17. The option circuit 100 controls the pulse length of the POWE signal in response to the input signals. The POWE signal has a pulse length of the predetermined cycle by the input signal when it is used in controlling the precharge signal state.

The output write enable control signal generating circuit 120 also includes a pulse circuit 200 which includes an inverter 19 having an input terminal connected to an output terminal of the option circuit, an inverter chain 21 for generating a time delayed output signal having a predetermined delay in response to the output signal from the inverter 19, and a NAND gate 23 for performing a NAND operation on the output signals from the inverter 19 and the inverter chain 21. An inverter driver 25 receives the output signal from the pulse circuit 200 and drives the output write enable control signal (POWE).

Figure 3:
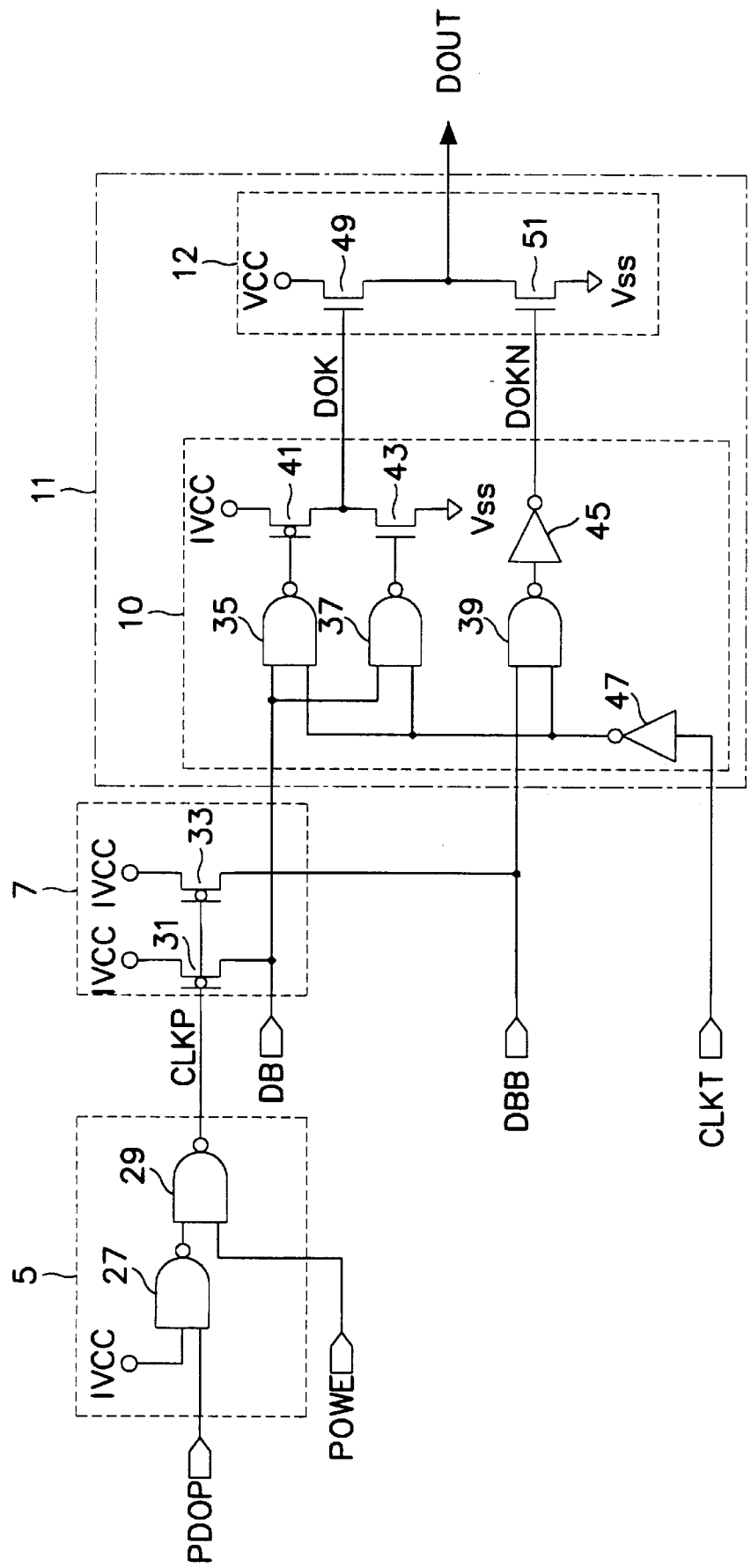
FIG. 3 is a schematic diagram of an embodiment of a data bus line signal control circuit in accordance with the present invention.

FIG. 3 is a detailed circuit diagram showing a data bus line signal control circuit which is controlled by an output write enable control signal (POWE) in accordance with the present invention. As shown in FIG. 3, the data bus line signal control circuit includes a precharge signal generating circuit 50 having a first NAND gate 27 for performing a NAND operation on a precharge control signal (PDOP) and an internal power source voltage (IVCC), and a second NAND gate 29 for generate a precharge signal (CLKP) by performing a NAND operation on POWE and the output signal of the first NAND gate 27. Precharge PMOS transistors 31 and 33 each have a gate for receiving CLKP, a source connected to an internal power source voltage terminal and a drain connected to one of the data bus lines (DB/DBB) to precharge DB/DBB to the internal power source voltage levels.

A data output buffer 10 includes NAND gates 35 and 37 each having a first input terminal connected to DB and a second input terminal connected to CLKT through an inverter 47. The data output buffer 10 also includes a PMOS transistor 41 having a gate connected to the output terminal of NAND gate 35, a current terminal connected to the internal power supply IVCC, and a source terminal connected to a node DOK. An NMOS transistor 43 has a gate connected to the output terminal of NAND gate 35, a current terminal connected to the ground voltage (VSS), and a source terminal connected to the node DOK. Transistors 41 and 43 generate a first output buffer signal (DOK) by buffering the data from DB. A NAND gate 39 has a first input terminal connected to DBB, a second input terminal connected to CLKT through the inverter 47, and an output terminal connected to the input terminal of an inverter which generates a second output buffer signal (DOKN) at its output terminal.

The data output buffer 10 also includes a data output driver 12 having a pull-up NMOS transistor 49 which has a gate connected to the node DOK and a pull-down NMOS transistor 51 which has a gate connected to the node DOKN. Transistor 49 pulls the data output line DOUT up to VCC in response to DOK, while transistor 51 pulls the data output line DOUT down to the ground voltage (VSS) level in response to DOKN. The data output buffer 10 and the data output driver 12 collectively form the data output buffer and driver circuit 110.

Figure 13:
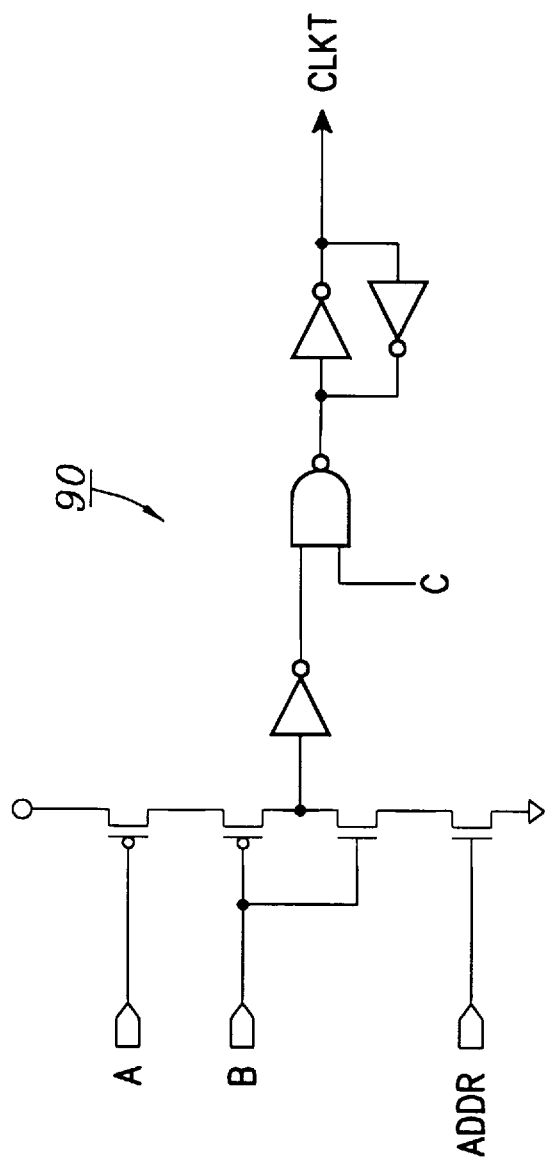
FIG. 13 is a schematic diagram of an embodiment of a data output buffer trigger signal generating circuit in accordance with the present invention.

The details of the data output buffer trigger signal generating circuit 90 are shown in FIG. 13. The signal A is the master clock of RASB which switches to a logic high when RASB is falling. The signal B is the master clock of CASB which switches to a logic high when CASB is falling. The signal C is the master clock of OEB which switches to a logic high when OEB is falling. The signal D is the master clock of WEB which switches to a logic high when WEB is falling.

Figure 5:
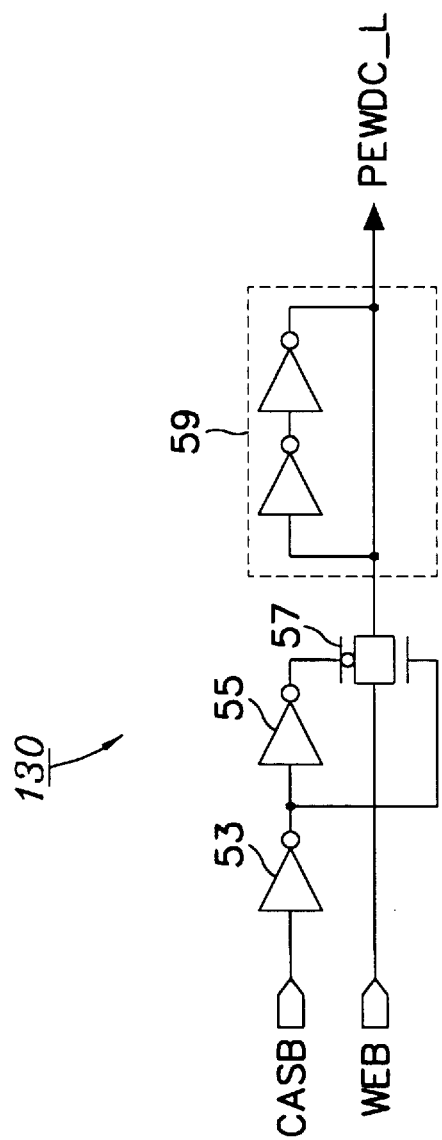
FIG. 5 is a schematic diagram of an embodiment of a write enable latch signal generating circuit in accordance with the present invention.

FIG. 5 is a detailed circuit diagram showing a write enable latch signal generating circuit according to the present invention. As shown in FIG. 5, the write enable latch signal generating circuit 130 includes a first inverter 53 which receives a column address strobe signal (CASB), a second inverter 55 having an input terminal connected to the output terminal of the first inverter 53, and a transmission gate 57 having an input terminal which receives the write enable signal (WEB), a PMOS terminal connected to an output terminal of the inverter 55 and a NMOS terminal connected to an output terminal of the inverter 53 to control the transmission of WEB through the gate. The output terminal of transmission gate 57 is connected to a latch circuit 59 having two inverters connected to latch data from the transmission gate and thus generate a write enable latch signal (PEWDC_L). The data output signal (DOUT) can be controlled by latching WEB which is processed in response to CASB.

In operation, CLKP, which is generated in response to PDOP and POWE, drives the gates of the PMOS transistors 31 and 33, being the data bus line precharge transistors, to precharge the data bus line. Either DOK or DOKN is enabled to input data to the output driver 12 by combining the data bus line signal having the data information from a memory cell with CLKT which is controlled by RASB, CASB, WEB and OEB. The pull-up transistor 49 and the pull-down transistor 51 are turned on and off by DOK and DOKN to control the data output (DOUT) state.

Figure 6:
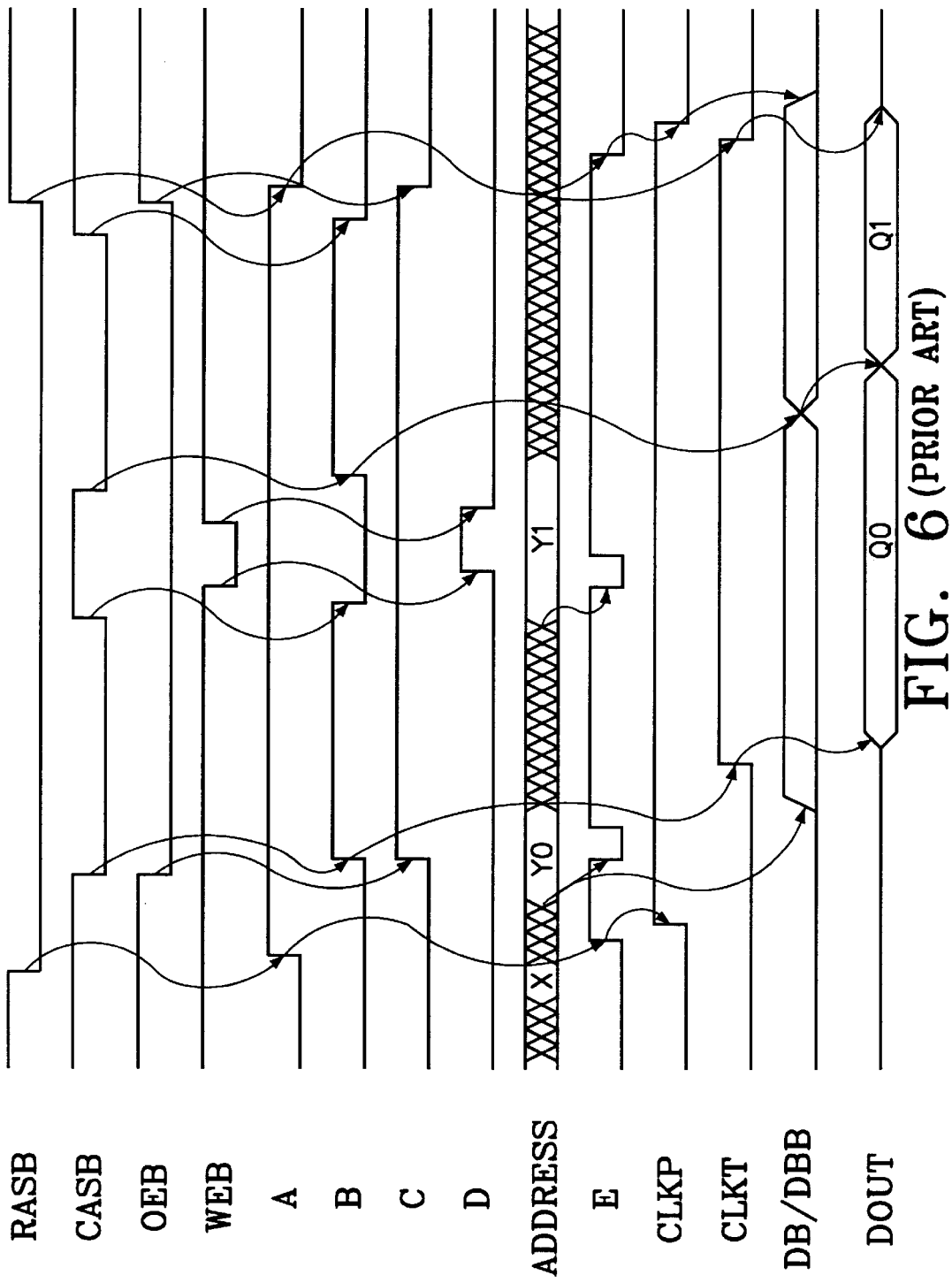
FIG. 6 is a timing diagram showing waveforms of various signals in a prior art data output control system for a semiconductor memory device that can operate in hyper page mode.

FIG. 6 is a timing diagram showing the operation of an embodiment of a hyper page mode output control circuit according to the prior art. As shown in FIG. 6, signals A, E and CLKP are controlled by signal RASB while signals B and CLKT are controlled by signal CASB. And also, signals E and DB/DBB are controlled by an external address. A data output cycle (DOUT) begins with CLKT, and finishes with B.

Figure 7:
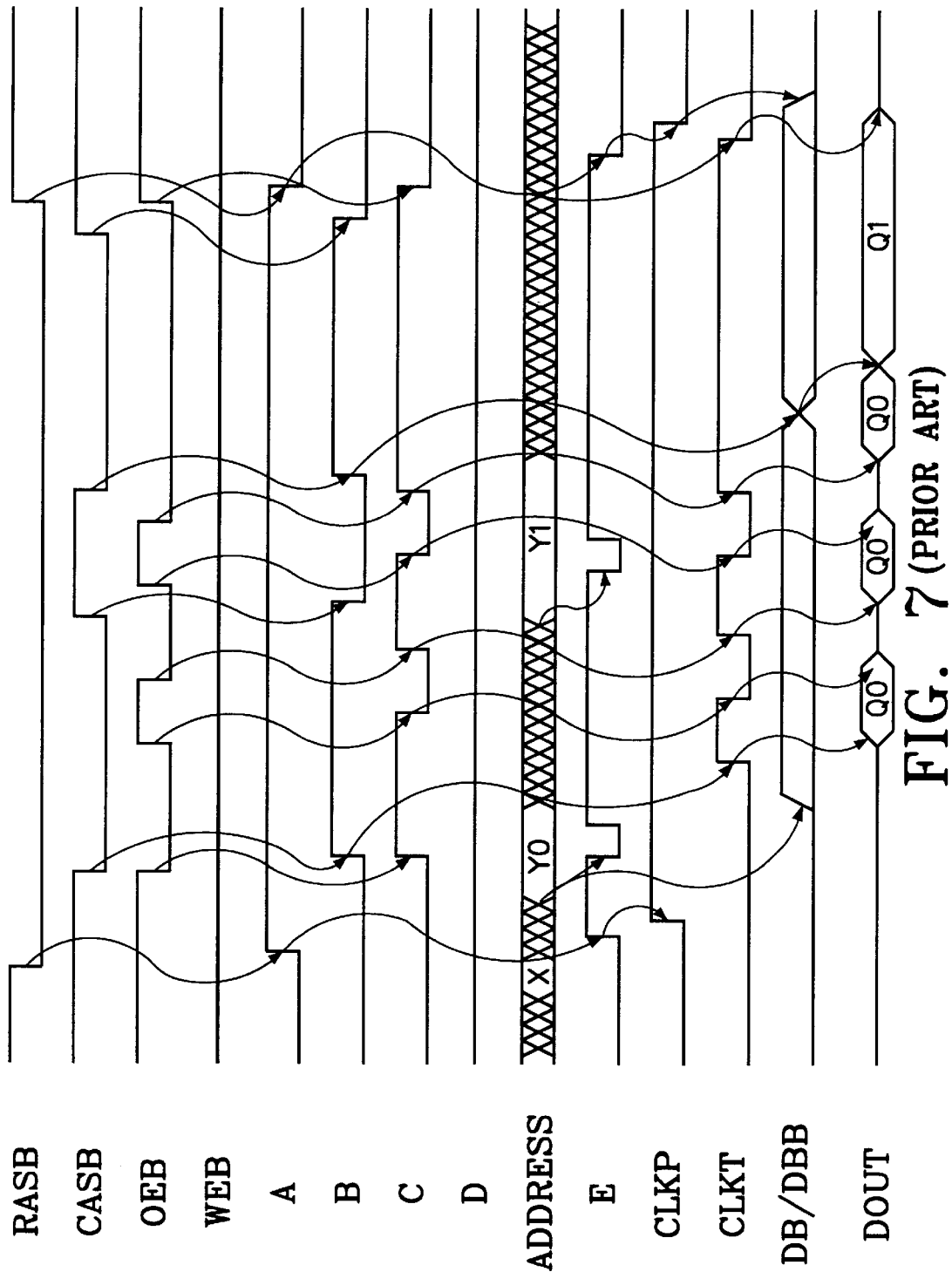
FIG. 7 is a timing diagram showing waveforms of various signals in a prior art data output control system for a semiconductor memory device that can operate in hyper page mode.

FIG. 7 is a timing diagram showing the operation of another embodiment of a hyper page mode output control circuit according to the prior art. As shown in FIG. 7, the operation is similar to that in FIG. 6, but the signal D is not controlled by the signal OEB. The signal CLKT, which is controlled by signal B is toggled. Whenever CLKT is toggled during the time period in which the address on data bus lines (DB/DBB) is not changed, the data output on DOUT is the same data Q0, and then the next data Q1 on the signal DB/DBB, which is controlled by B, is output. B is controlled by the enabling of signal CASB.

Figure 8:
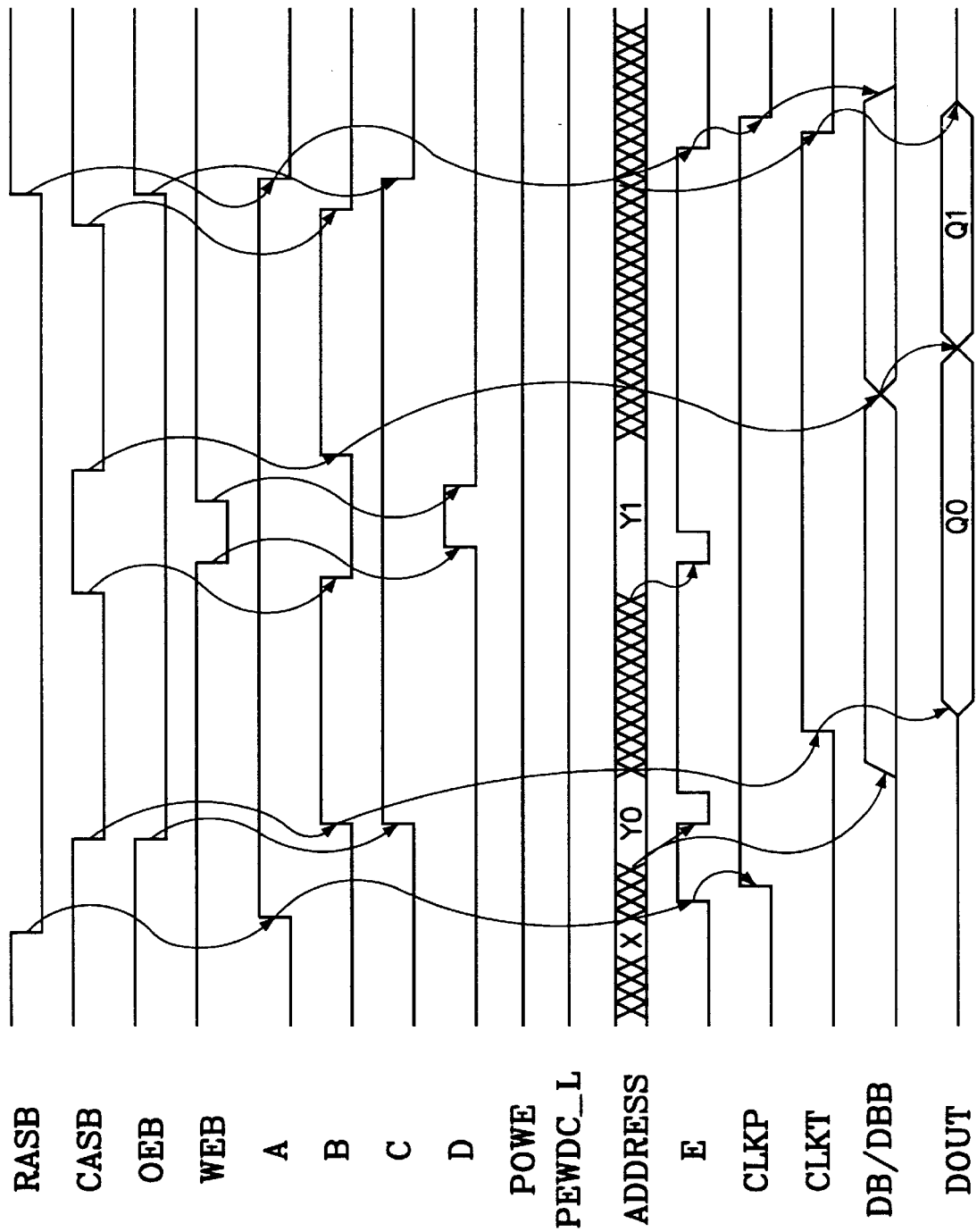
FIGS. 8 through 12 are timing diagrams showing waveforms of various signals in different modes of operation in an embodiment of a data output control system in accordance with the present invention.
Figure 9:
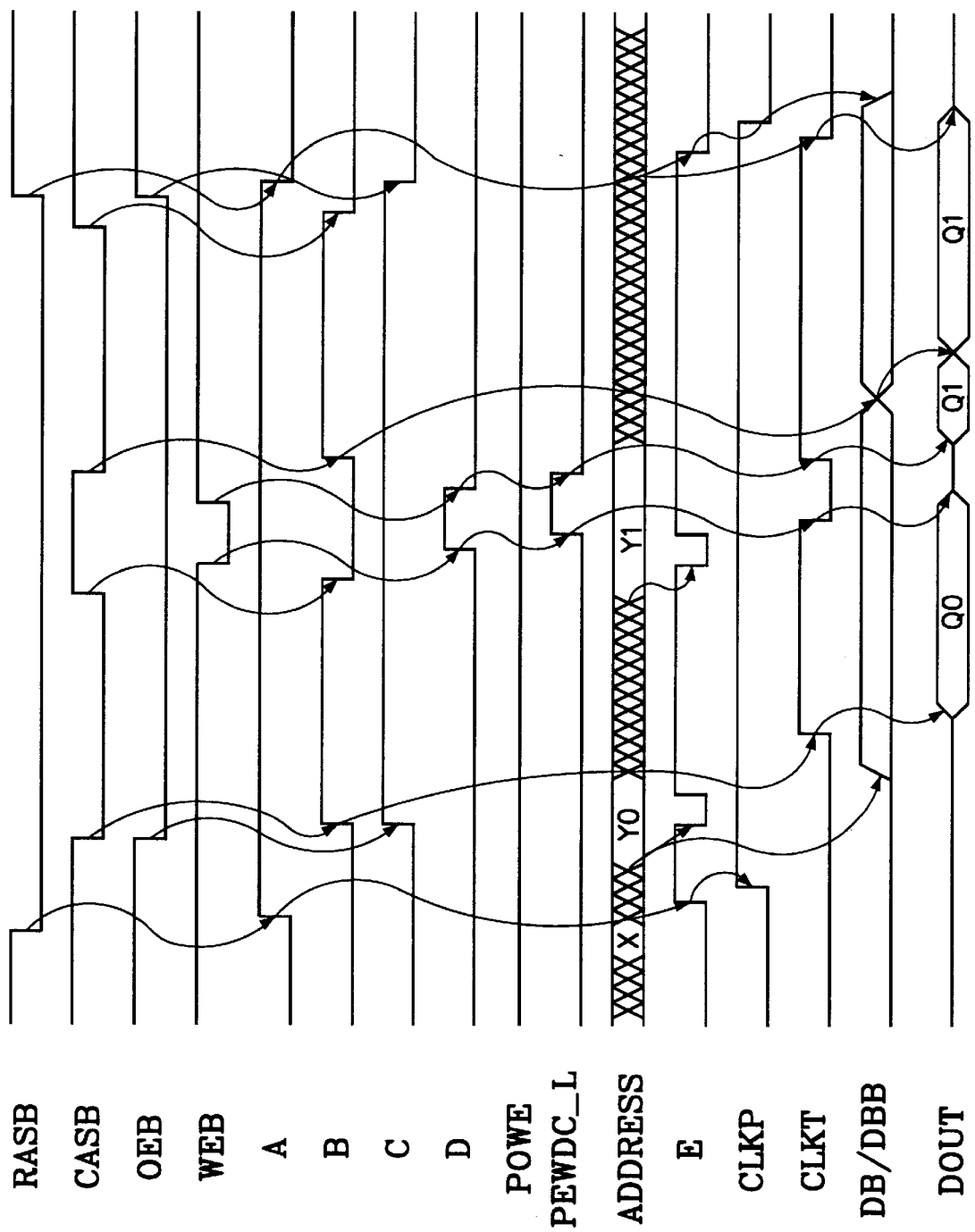
Figure 10:
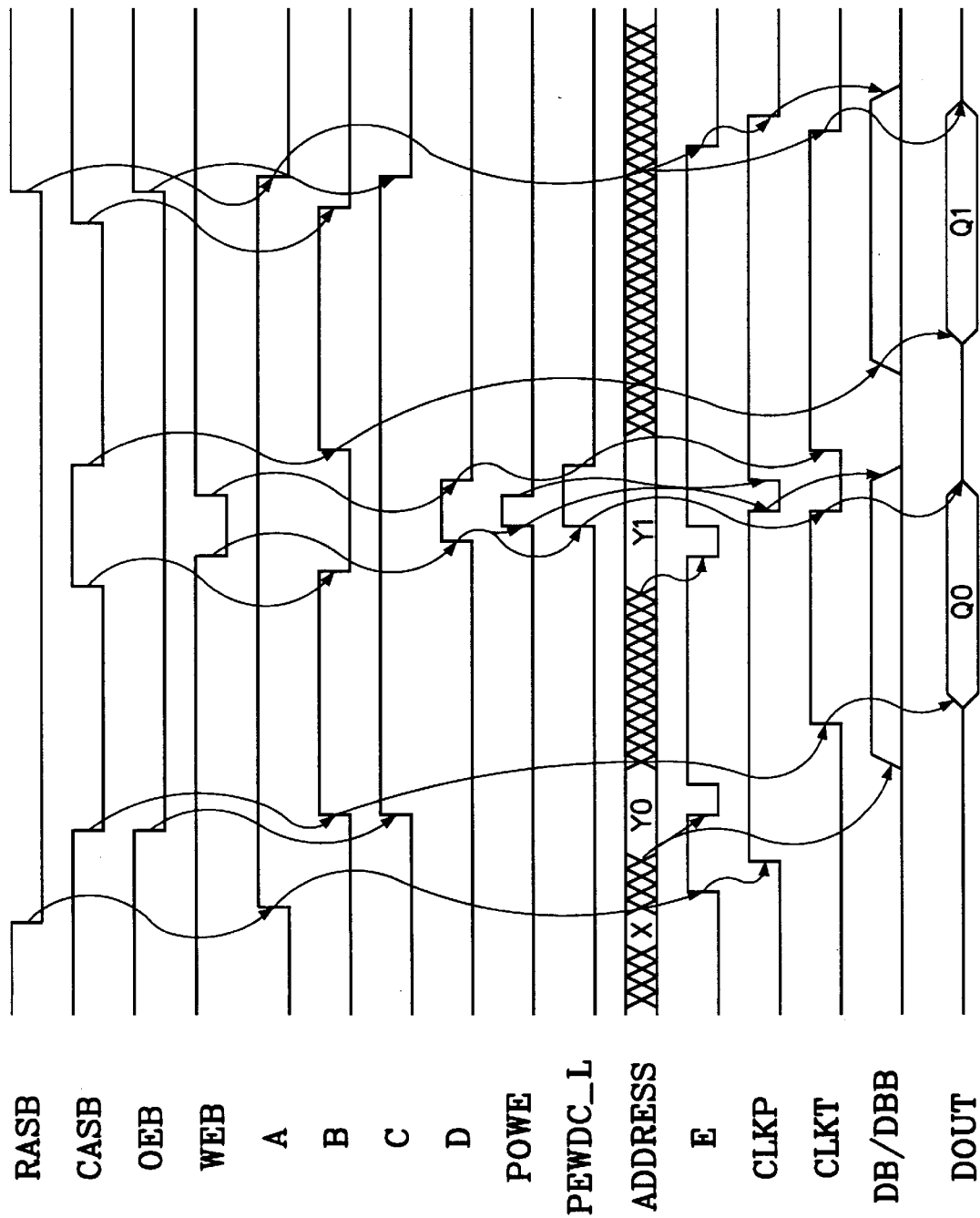

FIGS. 8, 9 and 10 show the operation of the same circuit under different conditions. The differences in the waveforms between FIGS. 8, 9 and 10 are determined by the states of switch circuits 50, 60, and 71 of FIG. 4.

FIG. 8 is a timing diagram showing an example of the operation of an embodiment of a hyper page mode control circuit according to the present invention. In the example cycle of FIG. 8, the output write enable control signal (POWE) and the write enable latch signal (PEWDC_L), which respectively control the trigger signal (CLKT) and the precharge signal (CLKP), both remain in the logic "Low" state.

FIG. 9 is a timing diagram showing another example of the operation of an embodiment of the hyper page mode output control circuit according to the present invention. As shown in FIG. 9, the operational procedure is similar to that in FIG. 8, but the write enable latch signal (PEWDC_L) is toggled by signal D which is controlled by the write enable signal (WEB).

FIG. 10 is a timing diagram showing yet another example of the operation of an embodiment of the hyper page mode output control circuit according to the present invention. As shown in FIG. 10, the operational procedure is similar to that of FIG. 9, but the signal D entirely controls signals POWE and PEWDC_L, and then toggles signals CLKP and CLKT.

Figure 11:
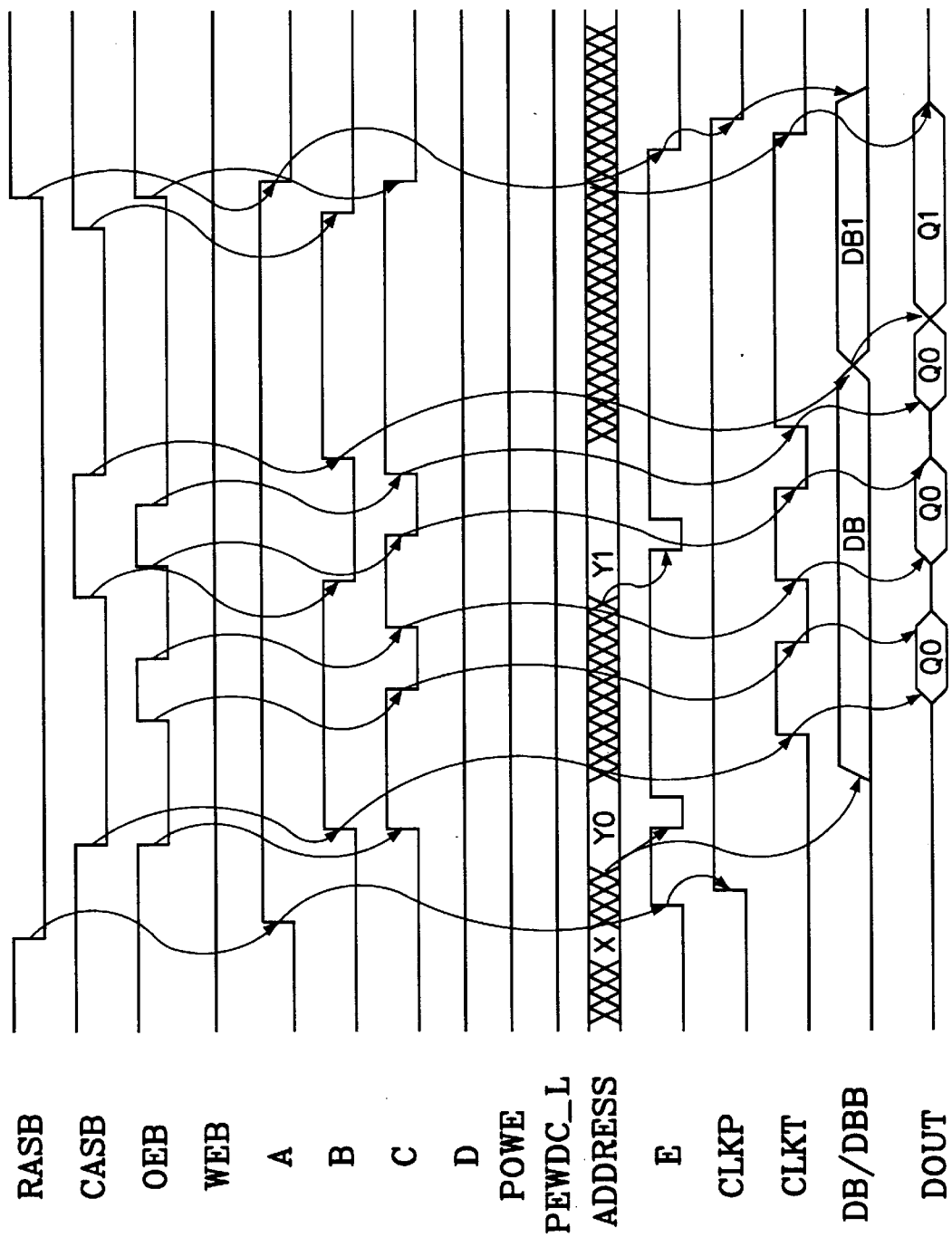

FIG. 11 is a timing diagram showing yet another example of the operation of an embodiment of the hyper page mode output control circuit according to the present invention. As shown in FIG. 11, when the write enable signal (WEB) is in a logic "High" state, signal C is toggled in response to the toggling of the output enable signal (OEB). C, in turn, controls the trigger signal (CLKT), thereby causing data to be output on the (DOUT) output.

Figure 12:
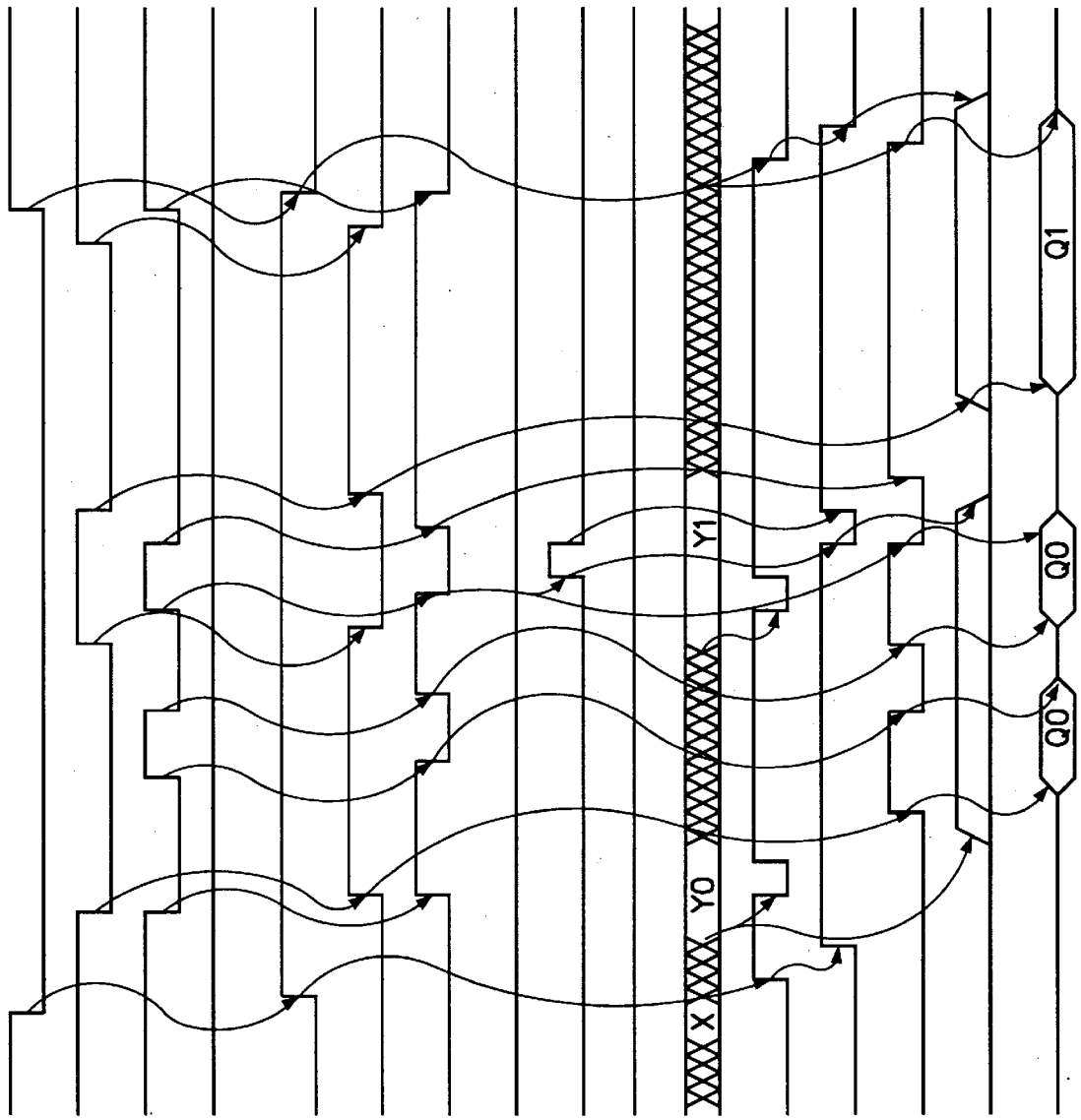

FIG. 12 is a timing diagram showing yet another example of the operation of an embodiment of the hyper page mode output control circuit according to the present invention. As shown in FIG. 12, the operational procedure is similar to that of FIG. 11, but when the output write enable control signal (POWE) changes to the logic "high" state when an the write enable signal (WEB) is "High", the signal CLKP is toggled.

Having described and illustrated the principles of the invention in a preferred embodiment thereof, it should be apparent that the invention can be modified in arrangement and detail without departing from such principles. I claim all modifications and variations coming within the spirit and scope of the following claims.

I claim:

1. A hyper page mode control circuit for a semiconductor memory device, the circuit comprising:

a data bus line;

a data output buffer coupled to the data bus line for outputting data from the data bus line responsive to a trigger signal;

a precharge circuit coupled to the data bus line for precharging the data bus line responsive to a precharge signal; and a precharge signal generating circuit coupled to the precharge circuit;

wherein the precharge signal generating circuit generates the precharge signal responsive to a precharge control signal and an output write enable control signal.

2. A control circuit according to claim 1 further including an output write enable control signal generating circuit coupled to the precharge signal generating circuit for generating the output write enable control signal.

3. A control circuit according to claim 2 wherein the output write enable control signal generating circuit generates the output write enable control signal responsive to either an output enable signal or a write enable signal.

4. A control circuit according to claim 2 wherein the output write enable control signal generating circuit generates the output write enable control signal responsive to an output enable signal, a write enable signal, and a column address strobe signal.

5. A control circuit according to claim 2 wherein the output write enable control signal generating circuit includes a first input terminal, a second input terminal, and a third input terminal coupled to receive a column address strobe signal, and wherein the control circuit further includes:

a first switch circuit coupled to the first input terminal to selectively couple the first input terminal to either an output enable signal or a supply voltage signal; and a second switch circuit coupled to the second input terminal to selectively couple the first input terminal to either a write enable signal or a supply voltage signal.

6. A control circuit according to claim 2 wherein the output write enable control signal generating circuit includes:

an option circuit for generating an output signal for controlling the length of a pulse in the output write enable control signal responsive to an output enable signal, a write enable signal, and a column address strobe signal; and a pulse circuit coupled to the option circuit for generating a time delayed output signal responsive to an output signal from the option circuit.

7. A control circuit according to claim 6 wherein the option circuit includes:

an inverter having an input terminal coupled to receive the output enable signal, and an output terminal;

a first NAND gate having a first input terminal coupled to receive the write enable signal, a second input terminal coupled to the output terminal of the inverter, and an output terminal; and a second NAND gate having first input terminal coupled to receive the column address strobe signal, a second input terminal coupled to the output terminal of the first NAND gate, and an output terminal.

8. A control circuit according to claim 6 wherein the pulse circuit includes:

a NAND gate having a first input terminal coupled to the option circuit, a second input terminal, and an output terminal for generating the output write enable control signal; and a delay circuit and coupled between the option circuit and the second input terminal of the NAND gate.

9. A control circuit according to claim 1 wherein the precharge signal generating circuit includes:

a first NAND gate having a first input terminal coupled to receive an internal power supply voltage, a second input terminal coupled to receive the precharge control signal, and an output terminal; and a second NAND gate having a first input terminal coupled to the output terminal of the first NAND gate, a second input terminal coupled to receive the output write enable control signal, and an output terminal for generating the precharge signal.

10. A hyper page mode control circuit for a semiconductor memory device, the circuit comprising:

a data bus line;

a data output buffer coupled to the data bus line for outputting data from the data bus line responsive to a trigger signal; and a data output buffer trigger signal generating circuit coupled to the data output buffer;

the data output buffer trigger signal generating circuit generating the trigger signal responsive to one or more strobe signals and a latch signal.

11. A control circuit according to claim 10 further including a write enable latch signal generating circuit coupled to the data output buffer trigger signal generating circuit for generating the latch signal.

12. A control circuit according to claim 11 wherein the write enable latch signal generating circuit generates the latch signal responsive to a write enable signal, and a column address strobe signal.

13. A control circuit according to claim 11 wherein:

the write enable latch signal generating circuit includes a fourth input terminal and a fifth input terminal coupled to receive a write enable signal; and the control circuit further includes a third switch circuit coupled to the fourth input terminal to selectively couple the fourth input terminal to either a column address strobe signal or a supply voltage signal.

14. A control circuit according to claim 11 wherein the write enable latch signal generating circuit includes:

a latch for latching a write enable signal, thereby generating the latch signal; and a transmission gate coupled to the latch so as to controllably transmit the write enable signal to the latch responsive to a column address strobe signal.

15. A method for controlling the state of an output data line in hyper page mode comprising:

outputting data from a data bus line to the output data line responsive to a trigger signal;

generating the trigger signal responsive to one or more strobe signals and a write enable signal; and precharging the data bus line responsive to either a write enable signal or an output enable signal.

16. A method according to claim 15 wherein precharging the data bus line responsive to either a write enable signal or an output enable signal includes:

precharging the data bus line responsive to a precharge signal; and generating the precharge signal responsive to either the write enable signal or the output enable signal.

17. A method for controlling the state of an output data line in hyper page mode comprising:

outputting data from a data bus line to the output data line responsive to a trigger signal; and precharging the data bus line responsive to either a write enable signal or an output enable signal;

wherein precharging the data bus line responsive to either a write enable signal or an output enable signal includes:

precharging the data bus line responsive to a precharge signal; and generating the precharge signal responsive to either the write enable signal or the output enable signal; and wherein generating the precharge signal responsive to either the write enable signal or the output enable signal includes:

generating an output write enable control signal responsive to either the write enable signal or the output enable signal; and generating the precharge signal responsive to a precharge control signal and the output write enable control signal.

18. A method for controlling the state of an output data line in hyper page mode comprising:

outputting data from a data bus line to the output data line responsive to a trigger signal;

precharging the data bus line responsive to either a write enable signal or an output enable signal; and precharging a data bus line before a first bit of data on the output data line changes to a second bit of data.

19. A method for controlling the state of an output data line in hyper page mode comprising:

outputting data from a data bus line to the output data line responsive to a trigger signal; and generating the trigger signal responsive to one or more strobe signals and a write enable signal;

wherein generating the trigger signal responsive to one or more strobe signals and a write enable signal includes:

generating a latch signal responsive to the write enable signal; and generating the trigger signal responsive to the one or more strobe signals and the latch signal.

* * * * *